US010274649B2

(12) United States Patent
Ruoff et al.

(10) Patent No.: US 10,274,649 B2
(45) Date of Patent: Apr. 30, 2019

(54) MIRROR AND RELATED EUV SYSTEMS AND METHODS

(71) Applicant: Carl Zeiss SMT GmbH, Oberkochen (DE)

(72) Inventors: Johannes Ruoff, Aalen (DE); Heiko Feldmann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 797 days.

(21) Appl. No.: 13/789,773

(22) Filed: Mar. 8, 2013

(65) Prior Publication Data

US 2013/0188163 A1 Jul. 25, 2013

Related U.S. Application Data

(63) Continuation of application No. PCT/EP2011/066667, filed on Sep. 26, 2011.

(60) Provisional application No. 61/387,544, filed on Sep. 29, 2010.

(30) Foreign Application Priority Data

Sep. 29, 2010 (DE) .......................... 10 2010 041 623

(51) Int. Cl.
*G02B 5/08* (2006.01)
*G03F 7/20* (2006.01)

(52) U.S. Cl.
CPC ....... *G02B 5/0891* (2013.01); *G03F 7/70066* (2013.01); *G03F 7/70225* (2013.01); *G03F 7/70283* (2013.01)

(58) Field of Classification Search
CPC ............ G03F 7/70066; G03F 7/70225; G03F 7/70283; G02B 5/0891
USPC ..................................... 355/67; 359/350, 353
See application file for complete search history.

(56) References Cited

U.S. PATENT DOCUMENTS

| 5,737,137 | A | | 4/1998 | Cohen et al. |
| 6,133,986 | A | * | 10/2000 | Johnson ............. G02B 21/0028 355/43 |
| 6,285,743 | B1 | | 9/2001 | Kondo et al. |
| 6,522,717 | B1 | | 2/2003 | Murakami et al. |
| 9,448,343 | B2 | * | 9/2016 | Kvamme ............. G02B 5/0891 |
| 9,658,533 | B2 | * | 5/2017 | Ruoff ........................ G02B 5/09 |
| 2005/0093041 | A1 | | 5/2005 | Singer et al. |
| 2005/0225739 | A1 | | 10/2005 | Hiura |

(Continued)

FOREIGN PATENT DOCUMENTS

| CN | 1647249 A | 7/2005 |
| CN | 101598904 A | 12/2009 |

(Continued)

OTHER PUBLICATIONS

German Examination Report, with English translation, issued in DE 10 2010 041 623.1 dated Jun. 29, 2011.

(Continued)

*Primary Examiner* — Deoram Persaud
(74) *Attorney, Agent, or Firm* — Fish & Richardson P.C.

(57) ABSTRACT

A mirror for EUV radiation includes a mirror body, which has at least one EUV radiation-reflecting region and at least two EUV radiation-permeable regions. A spatial separation of the illumination and imaging beam paths is possible with small angles of incidence and a large object-side numerical aperture.

20 Claims, 8 Drawing Sheets

(56) References Cited

U.S. PATENT DOCUMENTS

| | | | |
|---|---|---|---|
| 2005/0236584 A1 | 10/2005 | Tsuji | |
| 2006/0219959 A1 | 10/2006 | Hergenhan et al. | |
| 2006/0232867 A1* | 10/2006 | Mann | G02B 13/143 |
| | | | 359/858 |
| 2007/0223112 A1 | 9/2007 | Mann et al. | |
| 2008/0123807 A1 | 5/2008 | Warm et al. | |
| 2008/0137053 A1* | 6/2008 | Bleeker et al. | 355/66 |
| 2009/0174876 A1* | 7/2009 | Schriever | G03F 7/70041 |
| | | | 355/69 |
| 2009/0244696 A1 | 10/2009 | Geyl et al. | |
| 2010/0033704 A1* | 2/2010 | Shiraishi | G02B 17/0663 |
| | | | 355/71 |
| 2011/0199600 A1 | 8/2011 | Soer | |
| 2012/0274917 A1 | 11/2012 | Mann et al. | |
| 2013/0242278 A1* | 9/2013 | Enkisch | G03F 7/70308 |
| | | | 355/71 |
| 2015/0022799 A1 | 1/2015 | Mann et al. | |
| 2015/0160561 A1* | 6/2015 | Saenger | G03F 7/70066 |
| | | | 355/67 |

FOREIGN PATENT DOCUMENTS

| | | |
|---|---|---|
| CN | 102177470 A | 9/2011 |
| DE | 10139177 | 2/2003 |
| DE | 102 08 854 | 9/2003 |
| DE | 102008009600 | 8/2009 |
| DE | 102008046699 | 3/2010 |
| EP | 1 152 435 | 11/2001 |
| EP | 1 517 338 | 3/2005 |
| EP | 1 674 935 A2 | 6/2006 |
| EP | 1 840 622 | 10/2007 |
| EP | 1 927 892 | 6/2008 |
| JP | H11-238666 | 8/1999 |
| JP | 2001-116900 | 4/2001 |
| JP | 2003008124 | 1/2003 |
| JP | 2004-006716 | 1/2004 |
| JP | 2006-186365 | 7/2006 |
| JP | 2007-264636 | 10/2007 |
| JP | 2008-135743 | 6/2008 |
| JP | 2009-532891 | 9/2009 |
| JP | 2012-502490 | 1/2012 |
| JP | 4995379 B2 | 8/2012 |
| JP | 2013-513957 | 4/2013 |
| KR | 2005-0003392 | 1/2005 |
| WO | WO 03/092056 A1 | 11/2003 |
| WO | 2009024164 | 2/2009 |
| WO | 2011073039 | 6/2011 |

OTHER PUBLICATIONS

International Search Report from corresponding PCT Application No. PCT/EP2011/066667, dated Dec. 7, 2011, 3 pages.

Taiwanese Office Action with Search Report, with translation thereof, for corresponding TW Appl No. 100134521, dated Nov. 27, 2013.

Chinese office action, with English translation thereof, from counterpart CN Appl No. 2011 8004 7361.6, dated Sep. 29, 2014.

Taiwanese Office Action with English translation thereof for Appl. No. 100134521, 5 pages, dated Apr. 22, 2015.

Japanese Office Action and English translation thereof for corresponding JP Appl. No. 2013-530691, 7 pages, dated Jun. 25, 2015.

Chinese Office Action and English translation thereof for corresponding CN Appl. No. 201180047361.6, 12 pages, dated Aug. 4, 2015.

European office action with respect to parallel European patent application No. 11 761 081.6, dated Mar. 9, 2018.

* cited by examiner

MIRROR AND RELATED EUV SYSTEMS AND METHODS

CROSS-REFERENCE TO RELATED APPLICATIONS

This application is a continuation of, and claims priority under 35 USC 120 to, International Patent Application Serial Number PCT/EP2011/066667, filed Sep. 26, 2011, which claims benefit under 35 USC 119 of German Patent Application 10 2010 041 623.1, filed Sep. 29, 2010. International Patent Application Serial Number PCT/EP2011/066667 also claims priority under 35 USC 119 to U.S. Ser. No. 61/387,544, filed Sep. 29, 2010. The entire contents of International Patent Application Serial Number PCT/EP2011/066667 are incorporated by reference herein.

FIELD

The disclosure relates to a mirror for EUV radiation. The disclosure also relates to an illumination optical system, a projection optical system, an optical system, and an EUV projection exposure system. The disclosure further relates to a method for producing a microstructured or nanostructured component and a component produced by such a method.

BACKGROUND

Mirrors for EUV radiation and an EUV projection exposure system are known from EP 1 927 892 A1. An X-ray microscope is known from U.S. Pat. No. 6,522,717 B1.

SUMMARY

The disclosure provides a mirror for EUV radiation which results in improved optical quality when used in an EUV projection exposure system.

In one aspect, the disclosure provides a mirror for EUV radiation, which includes a mirror body including at least one EUV radiation-reflecting region and at least two EUV radiation-permeable regions. The radiation-permeable regions have an envelope delimiting an area which overlaps with at least 30% of the totality of the at least one radiation-reflecting region.

It was recognized according to the disclosure that, when used a lithography mask, the ability of a reticle to reflect drops sharply from a specific angle of incidence of the EUV radiation used for illum. An oblique illumination moreover leads to a considerable telecentric error.

However, with a perpendicular illumination of the reticle (in other words, with a course of the main beam of the illumination optical system parallel to the optical axis and with the course of the main beam perpendicular to the reticle) due to constructive constraints obscurations of the beam path in the illumination and/or projection optical system occur.

The main beam of an object field point (in other words, a specific point of the reticle) is defined here as the connection line between this object field point and a center of a pupil of the illumination optical system.

The disclosure provides a mirror for EUV radiation which includes at least one EUV radiation-reflecting region and at least two (such as at least three, at least four, at least five) EUV radiation-permeable regions. The EUV radiation-permeable regions are, for example, configured here as through-openings in the mirror body. The radiation-permeable regions are, for example, arranged disconnected in the mirror body. The radiation-permeable regions are, for example, arranged distributed over the mirror body in such a way that their envelope delimits an area, which overlaps with at least 30% (such as at least 40%, at least 50%, at least 60%, at least 70%, at least 80%, at least 90%) of the area of the totality of the radiation-reflecting regions.

It is possible to have a configuration of the mirror, which is inverted with respect to this, in which the reflecting and permeable regions are just interchanged. With this inverted configuration, a large number (such as at least two, at least three, at least four, at least five) of EUV radiation-reflecting regions are provided. The radiation-reflecting regions may, for example, be disconnected. They may, for example, be mechanically linked to one another by cross-struts. They can, for example, be applied to a braiding-type holder. In this configuration of the mirror, the EUV radiation-permeable areas make up, for example, at least 50% (such as at least 60%, at least 70%, at least 80%, at least 90%) of the total area of the mirror.

Using the mirror disclosed herein, it is possible, even with a high numerical aperture of the illumination optical system, to illuminate the reticle at a small angle of incidence without an obscuration of the EUV radiation reflected by the reticle. Using the mirror according to the disclosure, it is, for example, possible to guide the zero diffraction order of the EUV radiation reflected by the reticle, free of obscuration, through the projection optical system.

A spatial separation of the illumination and imaging beam path is possible using the mirror according to the disclosure.

In some embodiments, a mirror has a conjugated EUV radiation-reflecting region for each of the EUV radiation-permeable regions. Each EUV radiation-permeable region can be transferred by a rotation about an axis of symmetry into the EUV radiation-reflecting region which is conjugated thereto. The mirror has an associated EUV radiation-reflecting region for each of the EUV radiation-permeable regions. The EUV radiation-reflecting region is also called the region complementary to its respective radiation-permeable region. In particular, the region on the mirror, which is associated with a specific radiation-permeable region and in which the zero diffraction order of the radiation reflected by the reticle is imaged, is called the conjugated region. The terms "complementary region" and "conjugated region" are merely used to describe the subject matter disclosed herein. The corresponding regions do not necessarily have defined mechanical limitations. The complementary regions, in particular the conjugated regions, are in each case arranged at predetermined positions relative to the radiation-permeable regions on the mirror. In principle, the radiation reflected on the reticle, in particular the higher diffraction orders, can fall on any regions of the mirror. With knowledge of the structures of conventionally used reticles, it can, however, be predetermined by a targeted arrangement of the radiation-permeable and radiation-reflecting regions, which diffraction orders of the reflected light contribute to the projection of these reticles into the image field. It is, in particular, possible to configure the mirror for a bright field illumination or for a dark field illumination.

In some embodiments, each EUV radiation-permeable region is arranged symmetrically with respect to the axis of symmetry to the respective EUV radiation-reflecting region conjugated thereto. This arrangement is advantageous for bright field applications, as it ensures that at least the zero diffraction order of the radiation reflected on the reticle can in each case fall precisely on an EUV radiation-reflecting region. Thus, at least a part of the point-mirrored illumination pupil, in particular the entire point-mirrored illumination pupil is a component of the imaging beam path. The mirror, in particular the arrangement of the EUV radiation-reflecting and the EUV radiation-permeable regions, may be adapted to specific, predetermined reticles, in particular to typically used reticles. With a given reticle with a typical reticle structure, in particular with a known structure to be imaged, by a suitable arrangement of the EUV radiation-permeable regions on the mirror, it can also be achieved, in particular, that, in addition to or alternatively to the zero diffraction order, other diffraction orders, in particular the +/−first diffraction order of the radiation reflected on the reticle in each case falls precisely onto an EUV radiation-reflecting region.

If an "axis of symmetry" and a "symmetrical arrangement" of the regions is referred to here and below, this is, in each case, also taken to mean a correspondingly distorted configuration of the mirror, which is used with an oblique position of the mirror relative to the main beam of the beam path.

It is possible, with the mirror according to the disclosure, to illuminate the reticle in such a way that the angle of the main beam (CRA, chief ray angle) is smaller than the arcsin of the object-side numerical aperture (NAO), CRA<arcsin (NAO).

In some embodiments, the mirror has a large number of radiation-permeable regions and radiation-reflecting regions conjugated thereto. This allows a large number of different illumination settings, and it also allows for a reduction in the relative fraction of each individual radiation-permeable region and the respective radiation-reflecting region conjugated thereto of the radiation used in total to image the object field in the image field. The influence on the imaging quality, which it has, if a diffraction order of the reflected radiation associated with an individual, specific radiation-permeable region impinges by chance again on a radiation-permeable region and is therefore not reflected, is thereby reduced. As a result, the imaging quality can be made more robust overall. For this purpose, it is advantageous, in particular, if the radiation-permeable regions are in each case as small as possible in comparison to the total optically usable (in other words, reflecting) mirror face.

In some embodiments, a mirror has at least a part of the radiation-permeable regions arranged on a circle about the axis of symmetry. This can provide a particularly uniform, homogenous illumination of the reticle can be achieved. The radiation-permeable regions may, in particular, be arranged equidistantly on the circle here. An equidistant arrangement of an odd number of radiation-permeable regions leads here precisely to a bright field configuration as, in this case, a radiation-reflecting region opposes, with respect to the axis of symmetry, each radiation-permeable region.

Accordingly, an equidistant arrangement of an even number of radiation-permeable regions leads to a dark field configuration, as a further radiation-permeable region precisely opposes, with respect to the axis of symmetry, each radiation-permeable region. The zero diffraction order of the radiation reflected by the reticle from each radiation-permeable region therefore impinges, at least partially (such as completely) precisely on a radiation-permeable region again, is therefore not reflected by the mirror and therefore does not contribute to the imaging of the object field in the image field.

Moreover, the radiation-permeable regions may be arranged on a plurality of concentric circles about the axis of symmetry. As a result, different illumination settings with different angles of incidence are made possible. Interference effects can thereby be reduced.

In some embodiments, the radiation-permeable regions are arranged so that their common center of gravity coincides with the axis of symmetry. As a result, it becomes possible to illuminate the reticle in such a way that the main beam of the illumination radiation has an angle of incidence of 0°.

In one aspect, the disclosure provides an illumination optical system for illuminating an object field with EUV radiation using a mirror as disclosed herein.

In another aspect, the disclosure provides a projection optical system for imaging an object field into an image field using a mirror as disclosed herein. The mirror can be arranged close to a pupil An arrangement of a mirror M close to a pupil is present when the following condition is fulfilled:

$$P(M)=D(SA)/(D(SA)+D(CR))\geq 0.5.$$

D(SA) is the sub-aperture diameter of a beam pencil emitted from an object field point at the site of the mirror M and D(CR) is the maximum spacing of main beams of an effective object field, imaged by the imaging optical system, measured in a reference plane of the optical system, on the surface of the mirror M. The reference plane may be a plane of symmetry or a meridional plane of the imaging optical system. The definition of the parameter P(M) corresponds to that given in WO 2009/024 164 A1.

In a field plane, P(M) equals zero. In a pupil plane, P(M) equals one.

It is possible to ensure by an arrangement close to the pupil that at least the zero diffraction order of the radiation reflected by the reticle in each case falls completely on a radiation-reflecting region.

In one aspect, the disclosure provides an optical system for an EUV projection exposure system, wherein the optical system includes a mirror as disclosed herein.

In another aspect, the disclosure provides an EUV projection exposure system which includes an optical system including a mirror as disclosed herein.

Advantages of such an optical system and such an EUV projection exposure system correspond to those noted above.

In one aspect, the disclosure provides a method for producing a component using a projection exposure system disclosed herein.

In a further aspect, the disclosure provides a component produced by a method which includes using a projection exposure system as disclosed herein.

Advantages of such a method and component correspond to those noted above.

BRIEF DESCRIPTION OF THE DRAWINGS

Embodiments of the disclosure will be described in more detail below with the aid of the drawings, in which.

DETAILED DESCRIPTION

Figure 1:
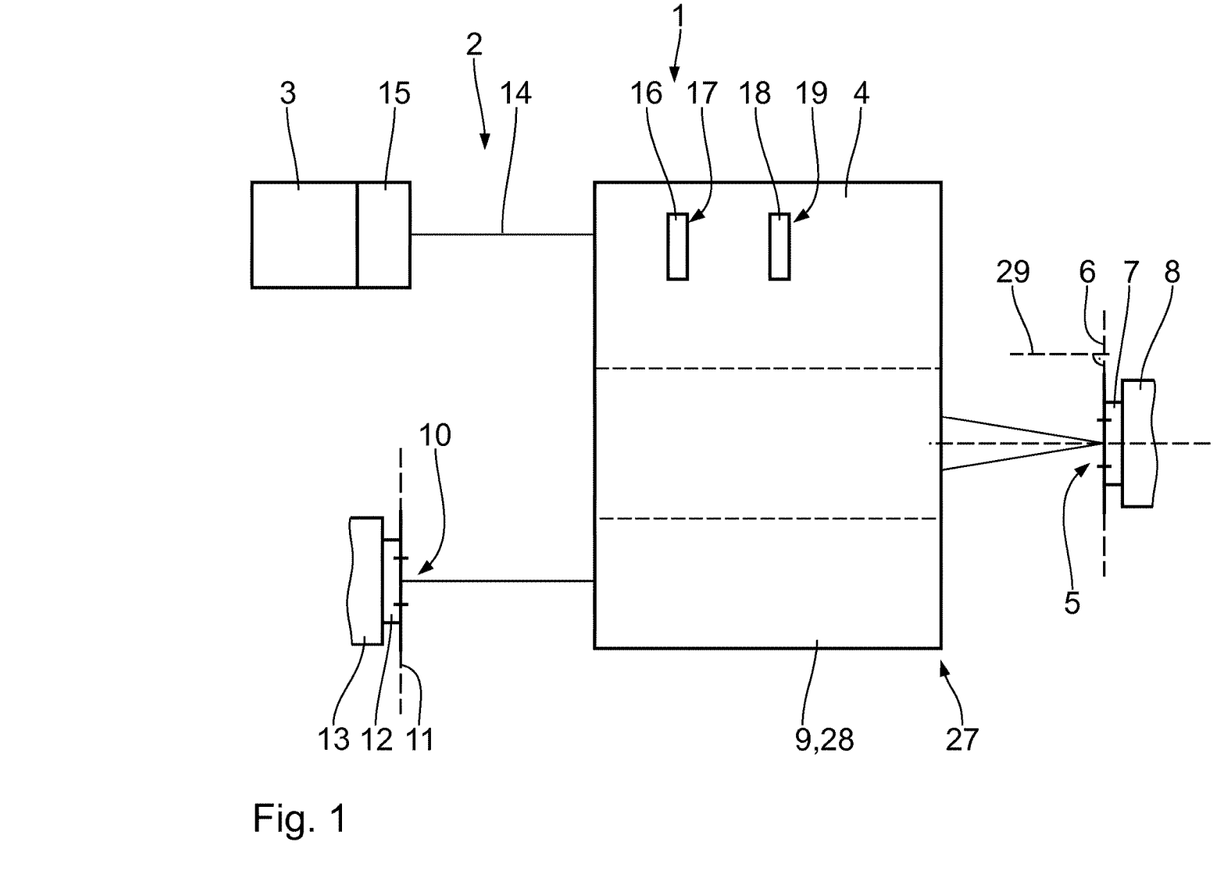
FIG. 1 shows a schematic view of the components of an EUV projection exposure system for EUV lithography.

FIG. 1 schematically shows, in a meridional section, the components of a projection exposure system 1 for microlithography. An illumination system 2 of the projection exposure system 1, apart from a beam source 3, includes an illumination optical system 4 for exposing an object field 5 in an object plane 6. A reticle 7, which is arranged in the object field 5 and is held by a reticle holder 8, only shown section-wise, is exposed here.

A projection optical system 9 is used to image the object field 5 in an image field 10 in an image plane 11. A structure on the reticle 7 is imaged on a light-sensitive layer of a wafer 12, which is arranged in the region of the image field 10 in the image plane 11 and is held by a wafer holder 13 also shown schematically.

The radiation source 3 is an EUV radiation source, which emits EUV radiation 14. The wavelength of the emitted useful radiation of the EUV radiation source 3 is in the range of 5 nm to 30 nm. Other wavelengths, which are used in lithography, and are available for the suitable light sources, are also possible. The radiation source 3 may be a plasma source, for example a DPP source or an LPP source. A radiation source, which is based on a synchrotron, can also be used as the radiation source 3. Information on a radiation source of this type is found by the person skilled in the art, for example in U.S. Pat. No. 6,859,515 B2. A collector 15 is provided to bundle the EUV radiation 14 from the EUV radiation source 3.

The EUV radiation 14 is also called illumination light or imaging light.

The illumination optical system 4 includes a field facet mirror 16 with a large number of field facets 17. The field facet mirror 16 is arranged in a plane of the illumination optical system 4, which is optically conjugated to the object plane 6. The EUV radiation 14 is reflected by the field facet mirror 16 to a pupil facet mirror 18 of the illumination optical system 4. The pupil facet mirror 18 has a large number of pupil facets 19. With the aid of the pupil facet mirror 18, the field facets 17 of the field facet mirror 16 are imaged in the object field 5.

For each field facet 17 on the field facet mirror 16, there is precisely one associated pupil facet 19 on the pupil facet mirror 18. A light channel is configured between a field facet 17 and a pupil facet 19, in each case. The facets 17, 19 of at least one of the facet mirrors 16, 18 may be switchable. They may, in particular be tiltably arranged on the field facet mirror 16, 18. It is possible here to make only one part tiltable, for example at most 30%, at most 50% or at most 70% of the facets 17, 19. It may also be provided to make all the facets 17, 19 tiltable. The switchable facets 17, 19 are, in particular, the field facets 17. By tilting the field facets 17, the allocation thereof to the respective pupil facets 19 and therefore the configuration of the light channels may be varied. For further details of the facet mirrors 16, 18 with tiltable facets 17, 19, reference is made to DE 10 2008 009 600 A1.

For further details of the illumination optical system 4, reference is also made to DE 10 2008 009 600 A1.

The beam path of the EUV radiation 14 in the illumination optical system 4 and the projection optical system 9 and, in particular, the structural arrangement of the field facet mirror 16 and the pupil facet mirror 18 cannot be inferred from FIG. 1.

The reticle holder 8 can be displaced in a controlled manner in such a way that, during the projection exposure, the reticle 7 can be displaced in a displacement direction in the object plane 6. Accordingly, the wafer holder 13 can be displaced in a controlled manner in such a way that the wafer 12 can be displaced in a displacement direction in the image plane 11. As a result, the reticle 7 and the wafer 12 can be scanned, on the one hand, through the object field 5 and, on the other hand, the image field 10. The displacement direction will also be called the scanning direction below. The displacement of the reticle 7 and the wafer 12 in the scanning direction can preferably take place synchronously with one another.

The projection optical system 9 includes a large number of projection mirrors, which are not shown in FIG. 1. The projection optical system 9 includes, in particular, at least three, in particular at least five, projection mirrors. It can, in particular, have at least six, seven or eight projection mirrors.

The projection optical system 9 includes, in particular, a mirror 20, which will be described in more detail below.

The mirror 20 has a mirror body 21 with a mirror face 24 with a large number of EUV radiation-permeable regions 22 and respective associated EUV radiation-reflecting regions 23. The respective EUV radiation-reflecting region 23 associated with an EUV radiation-permeable region 22 is also called a region complementary to the EUV radiation-permeable region 22. In particular, the radiation-reflecting region 23 associated with a specific radiation-permeable region 22 on the mirror 20, in which the 0 diffraction order of the radiation 14 reflected by the reticle 7 is imaged, is called the conjugated region 23. Obviously, the EUV radiation-reflecting region 23, which is complementary to an EUV radiation-permeable region 22, does not only include the respectively conjugated region 23, which is designated for viewing in the figures. In principle, the complementary region in each case includes the total mirror face 24.

The number of radiation-permeable regions 22 in the mirror 20 in particular corresponds precisely to the number of pupil facets 19 on the pupil facet mirror 18. However, this is not absolutely necessary. In particular in the case of switchable facets 17, 19, the number of radiation-permeable regions 22 may also be more or less than the number of pupil facets 19 on the pupil facet mirror 18 and/or the field facets 17 on the field facet mirror 16. In general, the mirror 20 has at least two EUV radiation-permeable regions 22. These are configured as through-openings in the mirror body 21. The EUV radiation-reflecting regions 23 may be configured as part regions of the reflecting mirror face 24 configured continuously apart from the through-openings 22. The EUV radiation-reflecting regions 23 may, in particular, be connected. The EUV radiation-permeable regions 22 are, in particular, arranged in a disconnected manner in the mirror body 21. The mirror face 24 may be convex, planar or concave.

The radiation-permeable regions 22 are arranged spaced apart from an axis 25 of symmetry of the mirror 20, in particular in such a way that each EUV radiation-permeable region 22 can be transferred into the respective EUV radiation-reflecting region 23 conjugated thereto by a rotation about the axis 25 of symmetry. The axis 25 of symmetry is, in particular, perpendicular to the mirror face 24. In a central region, in other words in the region of the point where the axis 25 of symmetry is pierced, the mirror 20, in other words the mirror face 24, is, in particular, reflecting. In principle, it is also conceivable for the mirror 20 to be provided with a central through-opening.

The mirror 20 has a discrete, at least two-fold rotational symmetry with respect to the axis 25 of symmetry. It may, in particular, have an odd, for example a three-fold, five-fold or seven-fold rotational symmetry. Higher-fold symmetries are also possible. In the case of an odd rotational symmetry, each EUV radiation-permeable region 22 is arranged symmetrically with respect to the axis 25 of symmetry to the respective EUV radiation-reflecting region 23 conjugated thereto.

The through-openings 22 have a shape which precisely corresponds to the shape of the pupil facets 19 on the pupil facet mirror 18. They are, in particular, circular. An oval, in particular an elliptical configuration, is also possible.

The arrangements of the radiation-permeable regions 22 on the mirror 20 and those of the pupil facets 19 on the pupil facet mirror 18 are advantageously adapted to one another.

Taken together, the radiation-permeable regions 22 cover at most 50%, in particular at most 40%, in particular at most 30%, in particular at most 20%, in particular at most 10%, of the mirror face 24.

Figure 4A:
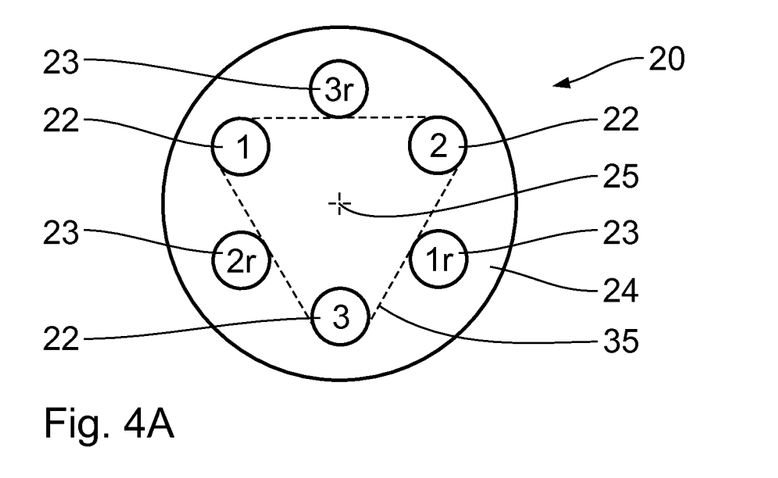
FIGS. 4A and 4B show schematic views of a mirror according to the disclosure according to a first embodiment.

In the embodiments shown in FIGS. 4A, B and 5A, B, the EUV radiation-permeable regions 22 are arranged on a circle about the axis 25 of symmetry. In general, at least one part of the radiation-permeable regions 22 is arranged on a circle about the axis 25 of symmetry. They are, in particular, arranged equidistantly on the circle. They may also be arranged on a plurality of concentric circles about the axis of symmetry. The radiation-permeable regions 22 are, in particular, arranged in such a way that their common centre of gravity coincides with the axis 25 of symmetry. The totality of the radiation-permeable regions 22 can be described by an outer envelope 35. The radiation-permeable regions 22 are, in particular, arranged in such a way on the mirror 20 that their outer envelope 35 delimits an area, which overlaps with at least 30%, in particular at least 40%, in particular at least 50%, in particular at least 60%, in particular at least 70%, in particular at least 80%, in particular at least 90%, of the area of the totality, in other words the combination of the radiation-reflecting regions 23, in particular the total mirror face 24.

A mirror 20 with three circular radiation-permeable regions 22 is shown for illustration in FIG. 4A, B. Accordingly, a mirror 20 with five respective circular radiation-permeable regions 22 is shown in FIG. 5A, B. Furthermore, the radiation-permeable regions 22 and the radiation-reflecting regions 23 conjugated thereto in each case are furthermore shown in FIGS. 4A and 5A for illustration, encircled, and numbered consecutively, the respective radiation-reflecting region 23 conjugated to a specific radiation-permeable region 22 being designated with the same number and an r placed thereafter. The encircling of the conjugated regions 23 serves merely for illustration and has no structural correspondence on the actual mirror 20. In particular, the total mirror face 24, depending on the structure of the reticle 7 and, connected therewith, the position of the diffraction orders of the radiation 14 reflected thereby, can form an EUV radiation-reflecting region 23. The radiation-reflecting regions 23 associated with the radiation-permeable regions 22 may, in particular, be configured to be overlapping and/or connected. The mirrors 20 shown in FIGS. 4A and 5A have a three-line or five-line rotational symmetry. The radiation-permeable regions 22 are therefore in each case arranged symmetrically with respect to the axis 25 of symmetry to the radiation-reflecting regions 23 conjugated thereto.

Figure 6:
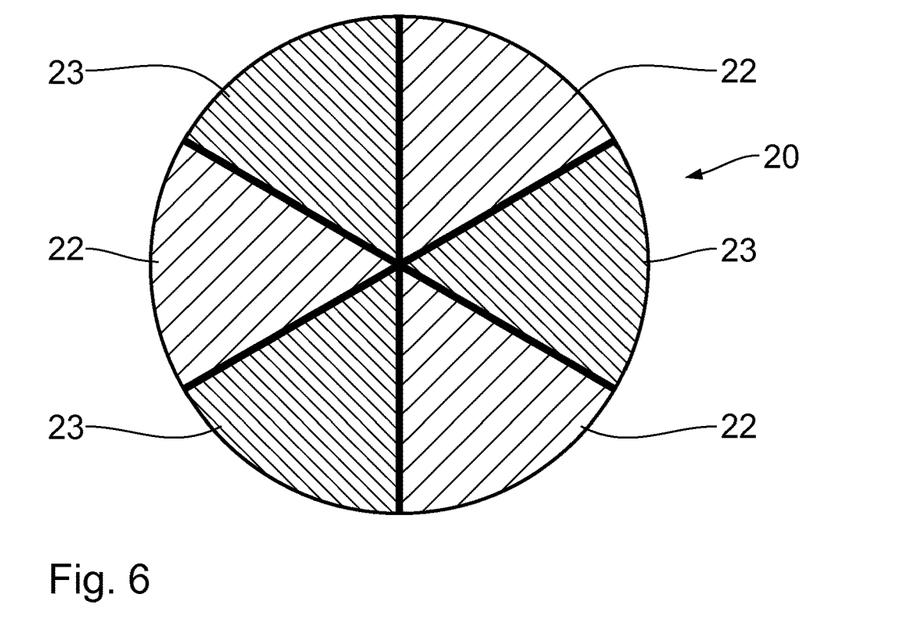
FIGS. 6 and 7 show schematic views of further embodiments of a mirror.

In the embodiment according to FIG. 6, the mirror 20 has three sector of a circle-shaped radiation-permeable regions 22.

Figure 7:
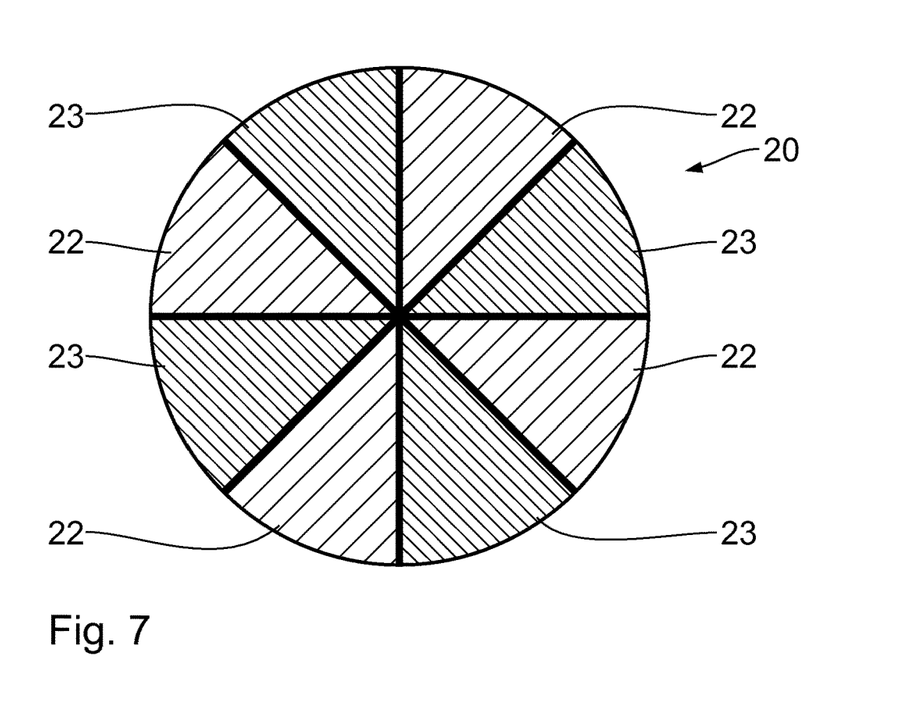

In the embodiment according to FIG. 7, the mirror 20 has four sector of a circle-shaped radiation-permeable regions.

Figure 3:
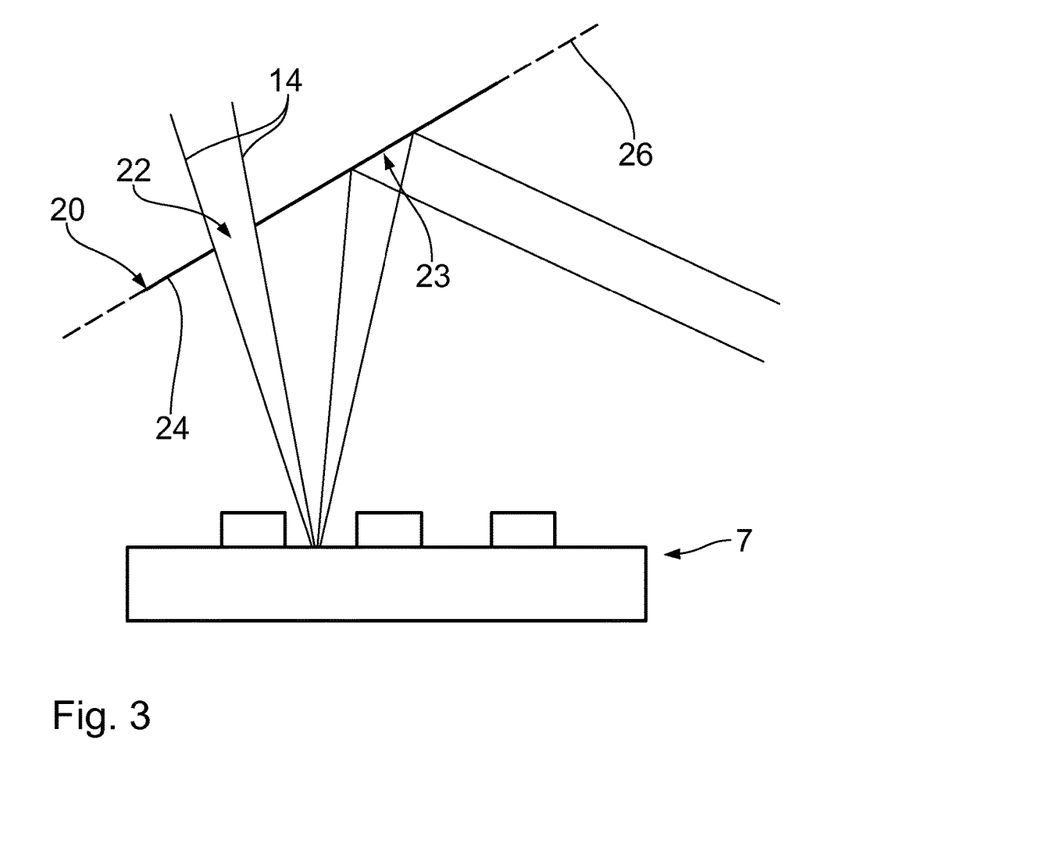
FIG. 3 shows a schematic view of a section enlargement of a beam path of illumination light and imaging light similar to FIG. 2, but with an alternative guidance of the beam path.

The function of the mirror 20 according to the disclosure is shown schematically in FIG. 3. The EUV radiation 14 from a light channel configured between one of the field facets 17 and the pupil facets 19, in each case, passes through the associated EUV radiation-permeable region 22 through the mirror 20, is reflected on the reticle 7 and impinges in the region of the pupil plane 26, which is, in particular, an exit pupil plane of the illumination optical system 4 and an entry pupil plane of the projection optical system 9, on the radiation-reflecting region 23, which is conjugated to the radiation-permeable region 22, from which it is further reflected via the projection optical system 9.

Figure 2:
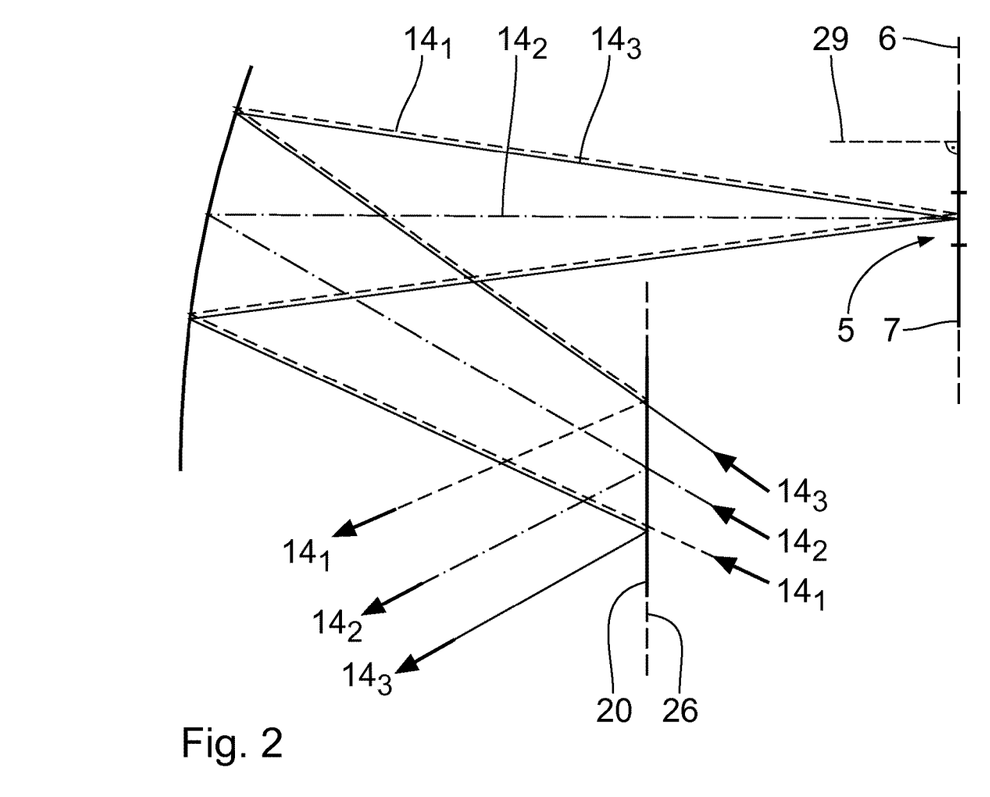
FIG. 2 shows a schematic view of a section enlargement of a beam path of illumination light and imaging light of the projection exposure system according to FIG. 1 in the region of a reflecting object to be imaged in the projection exposure in the form of a reticle.
Figure 4B:
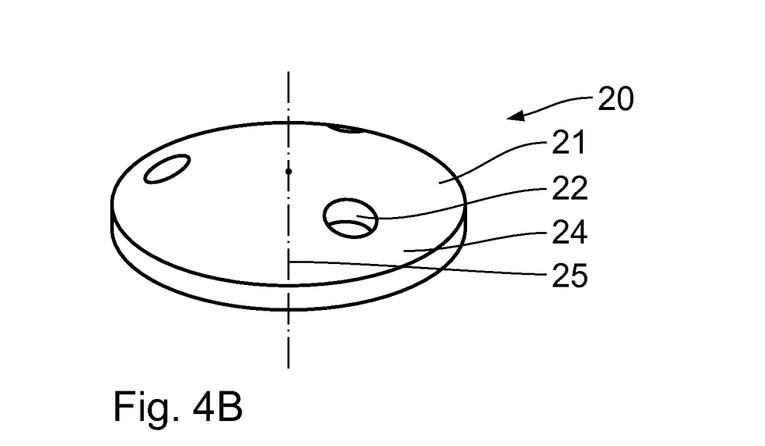
Figure 5A:
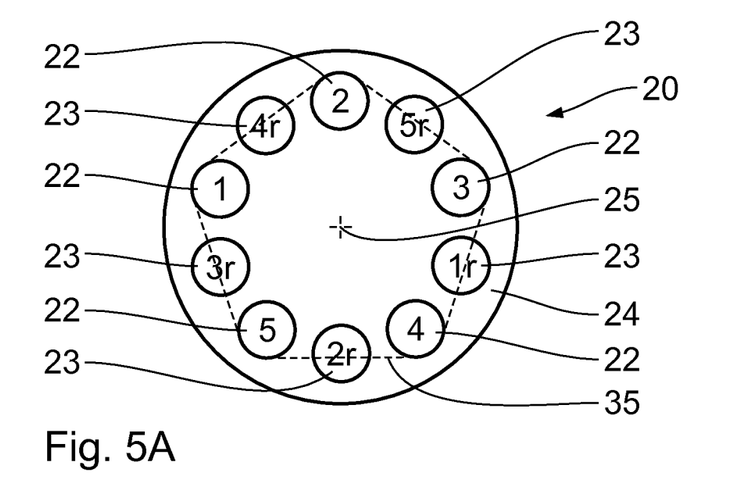
FIGS. 5A and 5B show schematic views of a mirror according to the disclosure in accordance with a further embodiment.
Figure 5B:
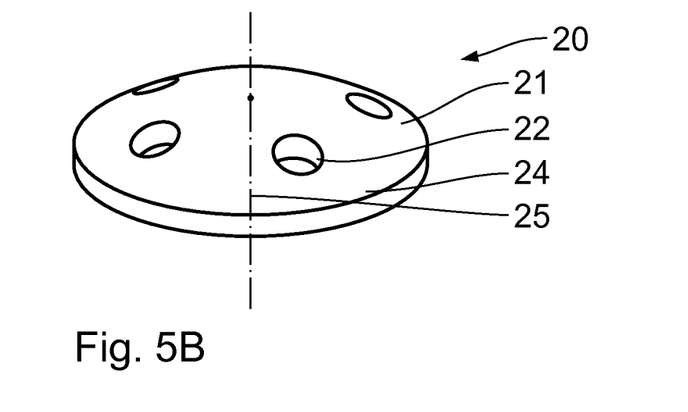

FIG. 2 shows a beam path by way of example, such as can be achieved, for example, with the mirror 20 according to FIGS. 4A and 4B. EUV radiation $14_1$, $14_2$ and $14_3$ is shown by way of example, which, in each case, passes through one of the through-openings 22 through the mirror 20. It is shown in this regard that the beam courses shown in FIG. 2 are only a projection into the plane of the drawing and therefore do not depict the incline to the plane of the drawing. Thus, in particular the beam $14_1$ passing through the mirror 20 does not coincide with the beam $14_3$ reflected back onto the mirror 20, but is skew with respect to the latter. Correspondingly, the beam $14_3$ passing through the mirror 20 is skew with respect to the beam $14_1$ reflected back onto the mirror 20. Furthermore, the beam $14_2$ passing through the mirror 20 is skew with respect to the beam $14_2$ reflected back onto the mirror 20.

The mirror 20 is, in particular, arranged close to the pupil in the projection optical system 9. There applies, in particular, $P(M) \geq 0.5$, in particular $P(M) \geq 0.7$, in particular $P(M) \geq 0.9$.

The mirror 20 is, in particular, arranged in a pupil plane 26. This ensures that the radiation 14 coming from a pupil facet 19 of the pupil facet mirror 18 in the region of the mirror 20 is at least approximately focused, and therefore at least the zero diffraction order of the associated radiation reflected on the reticle 7 impinges in a predetermined, limited region on the mirror 20. In the case of a bright field configuration, for example according to one of the FIG. 4, 5 or 6, the mirror 20 is configured in such a way that at least the zero diffraction order of the radiation 14 reflected on the reticle 7 from a radiation-permeable region 22 impinges precisely on the radiation-reflecting region 23 conjugated thereto and is therefore imaged by the projection optical system 9 in the image field 10. It can be achieved owing to the arrangement of the mirror 20 close to the pupil that the illumination and imaging beam paths are at least partially, in particular completely, spatially separated from one another. The separation is, in particular, the same for all the field points. In particular, the beam paths of the zero diffraction order run in regions completely spatially separated from one another.

As an alternative to an arrangement of the mirror 20 in the pupil plane 26, it is also possible to arrange the mirror 20 spaced apart from a pupil plane 26. This generally leads to a field dependency of the illumination, in other words, the illumination is no longer homogeneous in the entire object field. These effects of an incompletely imaged pupil can, in this case, be completely corrected, in particular by a field-dependent and structure-dependent correction method, which is known as "optical proximity correction" (OPC), as long as an adequate fraction of a minimum number of diffraction orders is transmitted for each field point. In a correction method of this type, by a single case-dependent structure adaptation of the mask, the image thereof on the wafer is improved. In particular, imaging errors are compensated and therefore corrected.

In a dark field configuration, the zero diffraction order of the radiation 14 reflected on the reticle 7, as shown, for example, in FIG. 7, impinges on the mirror 20 precisely on a further radiation-permeable region 22 and is therefore not reflected by the mirror 20.

An optical system 27 according to the disclosure includes the illumination optical system 4 and a projection optical system 28. The projection optical system 28 includes at least one mirror with at least one EUV radiation-permeable region 22, which is arranged in the beam path of the illumination optical system 4 in such a way that at least a part of the EUV radiation 14 is guided in the illumination optical system through this EUV radiation-permeable region 22. The beam path in the illumination optical system 4 is therefore guided, in other words, in such a way that the EUV radiation 14 passes through the at least one radiation-permeable region 22, before it is reflected by the reticle 7, and the reticle 7 is imaged by the projection optical system 9 in the image field 10. It is, in particular, provided that the projection optical system 28 is configured according to the projection optical system 9 described above.

When using the projection exposure system 1, the reticle 7 and the wafer 12, which carries a light-sensitive coating for the illumination light 14, are provided. At least one portion of the reticle 7 is then projected with the aid of the projection exposure system 1 onto the wafer 12. The reticle is thus illuminated with EUV radiation 14 in such a way that the main beam (CRA, chief ray angle) of the EUV radiation 14 impinges on the reticle 7 at an angle of incidence of at most 6°, in particular at most 3°, in particular at most 1°, in particular 0°. The angle of incidence is defined here as the angle between the main beam of the beam bundle being used to illuminate the reticle 7 and a normal 29 on the reticle 7. The angle of incidence of the main beam is, in particular, smaller than the object-side numerical aperture, CRA<arcsin (NAO).

During the projection of the reticle 7 onto the wafer 12, the reticle holder 8 and/or the wafer holder 13 can be displaced in the direction parallel to the object plane 6 or parallel to the image plane. The displacement of the reticle 7 and the wafer 12 may preferably take place synchronously with respect to one another.

Finally, the light-sensitive coating exposed by the illumination light is developed on the wafer 12. A microstructured or nanostructured component, in particular a semiconductor chip, is produced in this manner.

As an alternative to use in a projection exposure system, the mirror 20 according to the disclosure can also be used in an inspection device, in particular for inspecting reflective lithography masks or to inspect exposed wafer substrates. The image field 10 of the projection optical system 9 is, in this case, an inspection object field of the inspection device.

Figure 8:
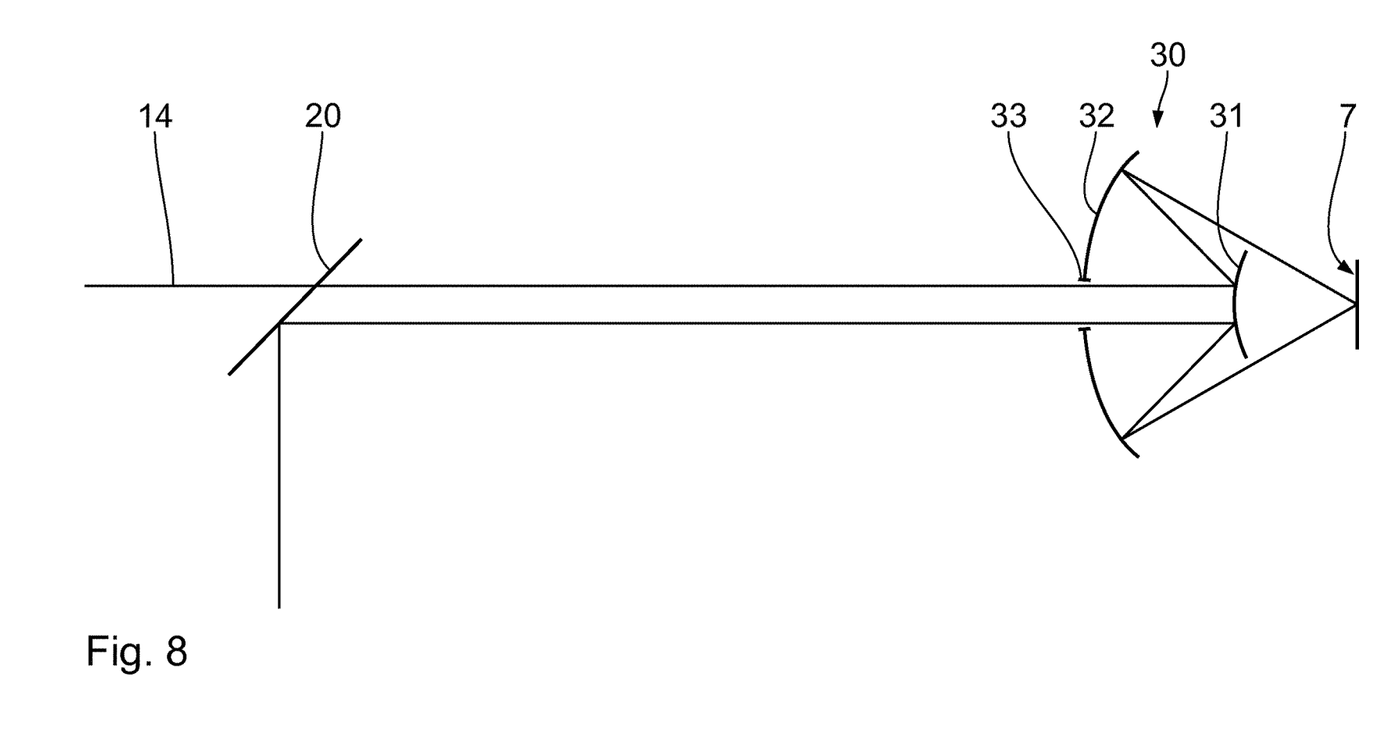
FIG. 8 shows a schematic view of the use of a mirror according to the disclosure in combination with a Schwarzschild optical system.

As shown schematically in FIG. 8, the mirror 20 according to the disclosure can also be used in combination with a Schwarzschild optical system 30, in particular a Schwarzschild lens system. The Schwarzschild lens system includes a primary mirror 31 and a secondary mirror 32. The primary mirror 31 is, in particular, convex. The secondary mirror 32 is, in particular concave. The secondary mirror 32 has a through-opening 33 for the EUV radiation 14.

The mirror 20 according to the disclosure may be provided as a folding mirror in a system of this type. It can, in particular, be arranged as part of the illumination optical system 4 in the beam path of the projection optical system 9 or as part of the projection optical system 9 in the beam path of the illumination optical system 4. It may be exchangeable. As a result, it is possible, in particular, to change between bright and dark field configurations. A system of this type can, in particular, be used in an inspection device for inspecting reflective lithography masks or for inspecting exposed wafer substrates.

Figure 9:
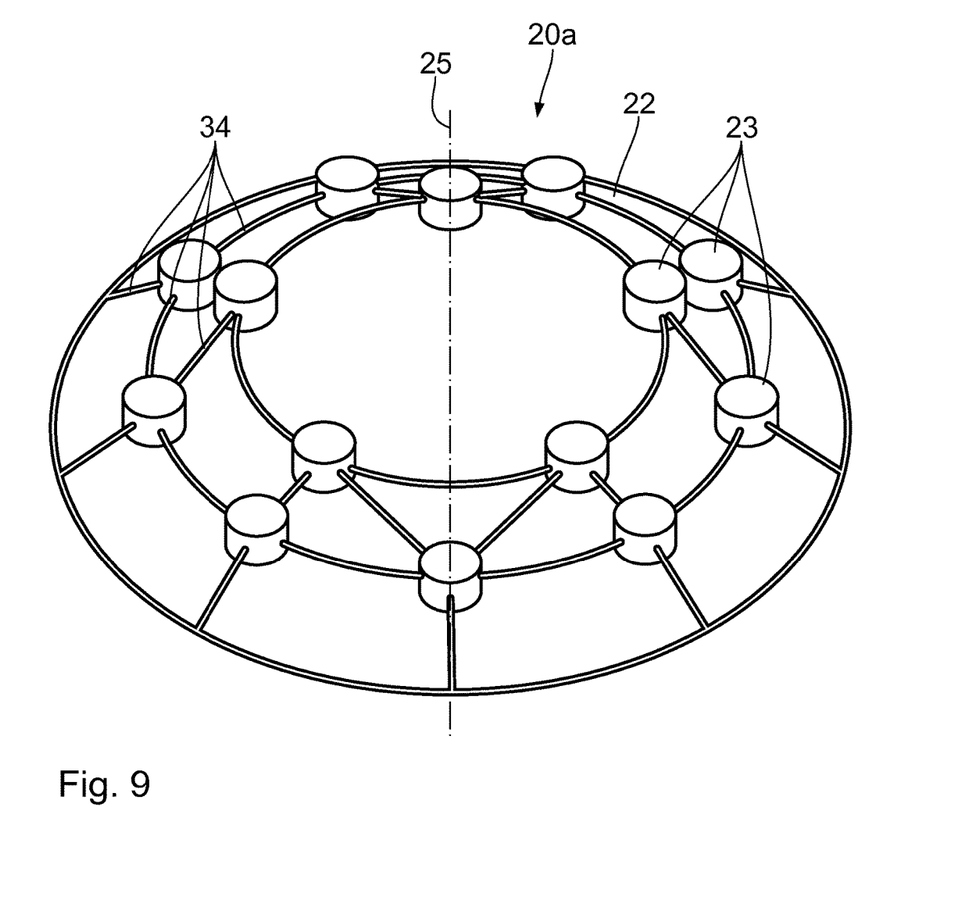
FIG. 9 shows a schematic view of a further embodiment of a mirror.

FIG. 9 shows an inverted configuration of the mirror 20a. The mirror 20a includes a large number of radiation-reflecting regions 23. The radiation-reflecting regions 23 are topologically disconnected.

The radiation-reflecting regions 23 are held relative to one another by a holding mechanism 34. The holding mechanism is, in particular configured in a strut-like manner. They may be linear or arcuate, in particular, arc of a circle-shaped. They may also be configured in a braiding-like manner. The holding mechanism 34 is as thin as possible to cause as little shading as possible. They cover, in particular, an area, which makes up at most 30%, in particular at most 25%, in particular at most 20%, in particular at most 15%, in particular at most 10%, in particular at most 5%, of the total face of the mirror 20a. The holding mechanism may, in particular, be made of aluminium, invar steel, titanium, copper, ceramics or carbon fibres. The holding mechanism 34 is, in particular, dimensioned in such a way that the radiation-reflecting regions 23 are reliably fixed with respect to one another.

In principle, it is conceivable to configure the mirror 20a monolithically, i.e. to make the radiation-reflecting regions 23 topologically connected.

In this embodiment, various, i.e. radiation-permeable regions 22 associated with different radiation-reflecting regions 23 may be topologically connected. They may, in particular, apart from the holding mechanism 34, form a connected, in particular a path-wise connected, but not simply connected overall region. In other words, the overall region of the radiation-permeable regions 22, apart from the holding mechanism 34, is connected, in particular path-wise connected. However, individual radiation-permeable regions 22 are, to a limited extent, and in particular, at least partially, separated from one another by the holding mechanism 34. Thus, the mirror 20a also has a large number, in particular at least two, in particular at least three, in particular at least four, radiation-permeable regions 22.

The mirror 20a is, in particular, part of the illumination optical system 4. It may be arranged in the beam path of the projection optical system 9. The mirror 20a is, in particular, arranged in the beam path of the projection optical system 9 in such a way that at least a part of the EUV radiation 14 in the projection optical system 9 is guided through the at least one EUV radiation-permeable region 22. The radiation-reflecting regions 23 may act here in the projection optical system 9 as obscuration stops.

In this embodiment, the radiation-reflecting regions 23 are arranged in such a way that the radiation 14 reflected by them on the reticle 7 after reflection on the reticle 7, in other words in the beam path of the projection optical system 9, falls precisely on the radiation-permeable region 22. This is in turn taken to mean that predetermined diffraction orders of the radiation 14 reflected on the reticle 7, in particular the zero diffraction order, fall on the radiation-permeable region 22. Obviously, the radiation-reflecting regions 23 may also be arranged on the mirror 20a in such a way that, additionally or alternatively to the zero diffraction order, the +/−first diffraction order of the radiation 14 reflected on the reticle 7 falls on the radiation-permeable region 22.

What is claimed is:

1. A mirror, comprising:
   a mirror body comprising a mirror face,
   wherein:
      the mirror face consists of at least one EUV radiation-reflecting region and at least five EUV radiation-permeable regions,
      the radiation-permeable regions are arranged disconnectedly in the mirror face;
      the mirror face has a conjugated EUV radiation-reflecting region for each EUV radiation-permeable region;
      each EUV radiation-permeable region is transferrable by a rotation about an axis of symmetry into its corresponding conjugated EUV radiation-reflecting region; and
      the mirror is an EUV mirror.

2. The mirror of claim 1, wherein each EUV radiation-permeable region is arranged symmetrically with respect to the axis of symmetry to its respective conjugated EUV radiation-reflecting region.

3. The mirror of claim 1, wherein at least a part of the radiation-permeable regions is arranged on a circle about the axis of symmetry.

4. The mirror of claim 1, wherein the radiation-permeable regions are arranged so that their common center of gravity coincides with an axis of symmetry.

5. An optical system, comprising:
   a mirror according to claim 1,
   wherein the optical system is an illumination optical system configured to illuminate an object field with EUV radiation via the mirror.

6. A system, comprising:
   an illumination optical system comprising a mirror according to claim 1,
   wherein the system is an EUV projection exposure system.

7. An optical system, comprising:
   a mirror according to claim 1,
   wherein the optical system is a projection optical system configured to image an object field into an image field via the mirror.

8. The optical system of claim 7, wherein the mirror is close to a pupil.

9. A system, comprising:
   a projection optical system comprising a mirror according to claim 1,
   wherein the system is an EUV projection exposure system.

10. A method, comprising:
    using an EUV projection exposure system to project at least a portion of a reticle onto a light-sensitive material,
    wherein the EUV projection exposure system comprises a mirror according to claim 1.

11. The mirror of claim 1, wherein an entire reflective area of the mirror face is configured to reflect EUV radiation having the same wavelength.

12. The mirror of claim 1, wherein a center of the mirror face is not EUV radiation-permeable.

13. The mirror of claim 1, wherein the radiation-permeable regions have an envelope delimiting an area which overlaps with at least 30% of the totality of the at least one radiation-reflecting region.

14. A mirror, comprising:
    a mirror body comprising a mirror face,
    wherein:
       the mirror face consists of at least one EUV radiation-reflecting region and at least five EUV radiation-permeable regions,
       the radiation-permeable regions are arranged disconnectedly in the mirror face;
       a center of the mirror face is not EUV radiation-permeable; and
       the mirror is an EUV mirror.

15. An optical system, comprising:
    a mirror according to claim 14,
    wherein the optical system is an illumination optical system configured to illuminate an object field with EUV radiation via the mirror.

16. A system, comprising:
    an illumination optical system comprising a mirror according to claim 14,
    wherein the system is an EUV projection exposure system.

17. An optical system, comprising:
    a mirror according to claim 14,
    wherein the optical system is a projection optical system configured to image an object field into an image field via the mirror.

18. The optical system of claim 14, wherein the mirror is close to a pupil.

19. A system, comprising:
    a projection optical system comprising a mirror according to claim 14,
    wherein the system is an EUV projection exposure system.

20. A method, comprising:
    using an EUV projection exposure system to project at least a portion of a reticle onto a light-sensitive material,
    wherein the EUV projection exposure system comprises a mirror according to claim 14.

* * * * *

UNITED STATES PATENT AND TRADEMARK OFFICE
CERTIFICATE OF CORRECTION

Page 1 of 1

PATENT NO. : 10,274,649 B2
APPLICATION NO. : 13/789773
DATED : April 30, 2019
INVENTOR(S) : Johannes Ruoff and Heiko Feldmann It is certified that error appears in the above-identified patent and that said Letters Patent is hereby corrected as shown below:

In the Specification

Column 1, Line 48: Delete "illum." and insert -- illumination. --, therefor.

Column 3, Line 11: Delete "+/-first" and insert -- +/- first --, therefor.

Column 4, Line 14 (approx.): Delete "pupil" and insert -- pupil. --, therefor.

Column 7, Line 52: Delete "FIG." and insert -- FIGS. --, therefor.

Column 7, Line 54: Delete "FIG." and insert -- FIGS. --, therefor.

In the Claims

Column 12, Line 44 (approx.): In Claim 18, delete "14" and insert -- 17 --, therefor.

Signed and Sealed this
Thirteenth Day of August, 2019

Andrei Iancu
*Director of the United States Patent and Trademark Office*